United States Patent
Hong

(10) Patent No.: US 8,120,910 B2
(45) Date of Patent: Feb. 21, 2012

(54) HEAT DISSIPATING STRUCTURE

(75) Inventor: Wei-Ling Hong, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 155 days.

(21) Appl. No.: 12/781,784

(22) Filed: May 17, 2010

(65) Prior Publication Data

US 2011/0228477 A1 Sep. 22, 2011

(30) Foreign Application Priority Data

Mar. 16, 2010 (TW) ................................ 99204612 U

(51) Int. Cl.
*H05K 7/20* (2006.01)
*G06F 1/20* (2006.01)
*F24F 13/08* (2006.01)

(52) U.S. Cl. .................. 361/695; 361/679.48; 236/49.5; 415/213.1; 454/184; 454/347; 454/353; 454/358; 454/359

(58) Field of Classification Search ............. 361/679.48, 361/694–695; 236/49.5; 415/213.1; 454/184, 454/224, 227, 259, 268, 318, 347, 353, 358–359
See application file for complete search history.

(56) References Cited

U.S. PATENT DOCUMENTS

| 2,279,425 | A | * | 4/1942 | Voysey | 415/146 |
| 2,339,363 | A | * | 1/1944 | Sutcliffe et al. | 454/351 |
| 2,632,377 | A | * | 3/1953 | Mader | 454/349 |
| 2,793,580 | A | * | 5/1957 | Hope et al. | 454/351 |
| 3,536,413 | A | * | 10/1970 | Omiya et al. | 415/211.2 |
| 5,288,202 | A | * | 2/1994 | Mancinelli | 415/25 |
| 6,011,689 | A | * | 1/2000 | Wrycraft | 361/695 |
| 6,229,701 | B1 | * | 5/2001 | Kung et al. | 361/688 |
| 6,504,715 | B2 | * | 1/2003 | Ota et al. | 361/695 |
| 6,522,539 | B2 | * | 2/2003 | Ota et al. | 361/695 |
| 6,896,612 | B1 | * | 5/2005 | Novotny | 454/184 |
| 7,070,385 | B2 | * | 7/2006 | Milana | 415/25 |

\* cited by examiner

*Primary Examiner* — Robert J Hoffberg
(74) *Attorney, Agent, or Firm* — Winston Hsu; Scott Margo

(57) ABSTRACT

A heat dissipating structure includes a frame. An accommodating space is formed inside the frame for accommodating a fan, and an opening is formed on a lateral side of the frame. The heat dissipating structure further includes at least one shutter connected to the frame in a rotatable manner. The fan is disposed on a side of the shutter. The shutter prevents airflow driven by the fan from flowing back to the other side of the shutter through the opening when the shutter rotates to a close position. The heat dissipating structure further includes a resilient component for providing a resilient force to the shutter so as to drive the shutter to the close position.

6 Claims, 4 Drawing Sheets

US 8,120,910 B2

HEAT DISSIPATING STRUCTURE

BACKGROUND OF THE INVENTION

1. Field of the Invention

The present invention relates to a heat dissipating structure which prevents airflow from flowing back, and more particularly, to a heat dissipating structure utilizing a resilient component to drive a shutter to close an opening so as to prevent airflow from flowing back.

2. Description of the Prior Art

Consumer electronic products have more and more functions with progress of technology. Hence the demand for performance increases accordingly. The high performance brings high energy consumption resulting in resonance, noise, thermal problems, and so on. For example, the reliability and stability of electronic products reduce if heat generated by internal electronic components can not be dissipated effectively. The conventional solution of thermal problem is utilizing a heat dissipating system, such as a fan, a heat sink, a heat pipe, or a cooling chip for reducing temperature of the electronic components so that the electronic products can operate normally.

For instance, in order to dissipate heat generated by electronic components disposed inside a computer system in an air-cool manner effectively, a plurality of fans is utilized to exhaust cold air from surroundings into a main board disposed inside the computer system, so as to cool the electronic components disposed on the main board. However, when a fan stops by being shut down or being broken, airflow driven by the other fans flows back to the surroundings through an opening of the fan due to pressure difference, so that the cooling efficiency of the fan is decreased. In order to solve the above-mentioned drawback, a conventional backflow-prevention mechanism prevents the corresponding opening when the fan is shut down for preventing the airflow driven by the other fans from flowing back to the surroundings through the opening of the fan due to the pressure difference. The conventional backflow-prevention mechanism often includes a shutter pivoted to a shaft, and the shutter covers the opening by its gravity. That is to say, the airflow driven by the fan moves the shutter away from the opening when the fan works. When the fan stops, the gravity of the shutter drives the shutter to cover the opening naturally. It should be mentioned that when the airflow driven by the fan pushes the shutter, a specific angle between the shutter and the opening is kept due to force equilibrium of the gravity of the shutter and the airflow. Therefore, part of the opening is covered and the airflow passing through the opening is decreased, so that the cooling efficiency of the fan is decreased. The angle between the shutter and the opening in the force equilibrium can be adjusted according to the power of the fan and material of the shutter, which results in design limitation. For example, the fan with low power is unsuitable to the shutter having heavy weight, but the shutter with slight weight does not have enough structural strength. Thus, design of a heat dissipating structure capable of preventing the airflow from flowing back is an important issue in the thermal design.

SUMMARY OF THE INVENTION

The present invention provides a heat dissipating structure utilizing a resilient component to drive a shutter to close an opening, so as to prevent airflow from flowing back for solving above drawbacks.

According to the claimed invention, a heat dissipating structure includes a frame forming an accommodating space inside. An opening is formed on a lateral side of the frame. The heat dissipating structure further includes at least one shutter pivoted to the frame, and the fan is disposed on a side of the shutter. The heat dissipating structure further includes a resilient component for rotating the shutter.

According to the claimed invention, the heat dissipating structure includes one plurality of shutters, and a linkage connected to the plurality of shutters so as to drive the plurality of shutters simultaneously.

According to the claimed invention, the resilient component is connected to a shutter of the plurality of shutters, and the linkage drives the other shutters to rotate in a direction whereto the resilient component drives the shutter.

According to the claimed invention, the resilient component is connected to the linkage.

According to the claimed invention, at least one protruding part is disposed on a side of the linkage for contacting the frame.

According to the claimed invention, an electronic device includes a heat source, and a heat dissipating module for dissipating heat generated by the heat source. The heat dissipating module includes a fan for driving airflow so as to dissipate the heat generated by the heat source, and a heat dissipating structure for guiding the airflow driven by the fan. The heat dissipating structure includes a frame forming an accommodating space inside for accommodating the fan. An opening is formed on a lateral side of the frame. The heat dissipating structure further includes at least one shutter connected to the frame in a rotatable manner. The shutter prevents the airflow driven by the fan from flowing back to the other side of the shutter through the opening when the shutter rotates to a close position. The heat dissipating structure further includes a resilient component for providing a resilient force to the shutter so as to drive the shutter to the close position.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
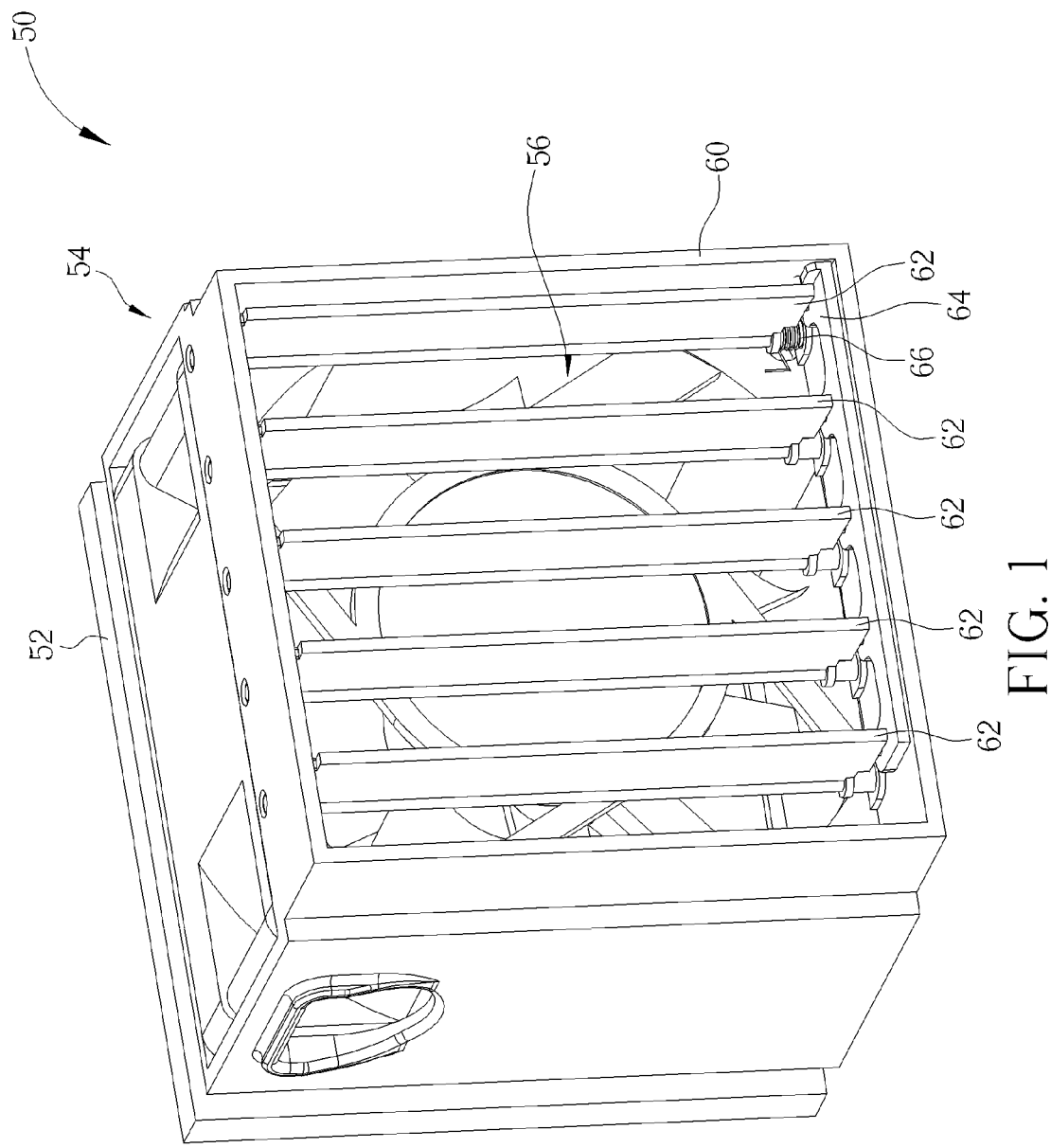
FIG. 1 is a diagram of an electronic device according to a preferred embodiment of the present invention.
Figure 2:
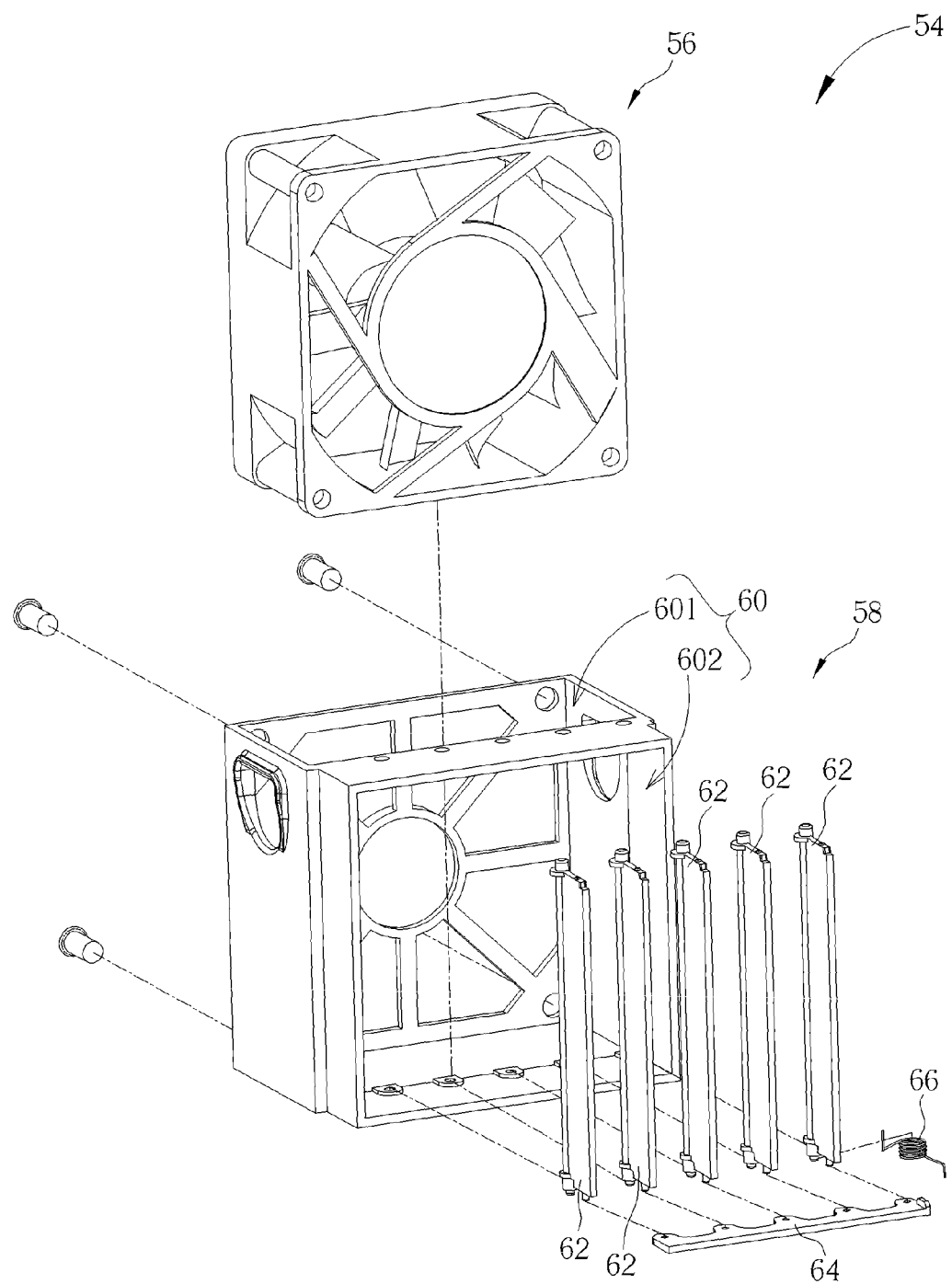
FIG. 2 is an exploded diagram of a heat dissipating module according to the preferred embodiment of the present invention.

Please refer to FIG. 1. FIG. 1 is a diagram of an electronic device 50 according to a preferred embodiment of the present invention. The electronic device 50 can be a computer device. The electronic device 50 includes a heat source 52, which can be an electronic component capable of generating heat. The electronic device further includes a heat dissipating module 54 for dissipating the heat generated by the heat source 52. The heat dissipating module 54 can be a detachable and portable heat dissipating module, so as to be assembled in different electronic devices. Please refer to FIG. 1 and FIG. 2. FIG. 2 is an exploded diagram of the heat dissipating module 54 according to the preferred embodiment of the present invention. The heat dissipating module 54 includes a fan 56 for driving airflow so as to dissipate the heat generated by the heat source 52. That is to say, the fan 56 drives cold air from surroundings to the heat source 52 for cooling the heat source 52. The heat dissipating module 54 further includes a heat dissipating structure 58 for guiding the airflow driven by the fan 56. The heat dissipating structure 58 includes a frame 60. An accommodating space 601 is formed inside the frame 60 for accommodating the fan 56, and an opening 602 is formed on a lateral side of the frame 60. The heat dissipating structure 58 further includes a plurality of shutters 62 pivoted to the frame 60 and disposed on a side of the opening 602. Each shutter 62 can be connected to the frame 60 via a shaft in a pivotable manner. The fan 56 is disposed on a side of the plurality of shutters 62, and the plurality of shutters 62 can control whether the airflow passes through the opening 602 on the frame 60 and control an amount of the airflow passing through the opening 602 on the frame 60. The heat dissipating structure 58 further includes a linkage 64 connected to the plurality of shutters 62 so as to drive the plurality of shutters 62 simultaneously.

Figure 3:
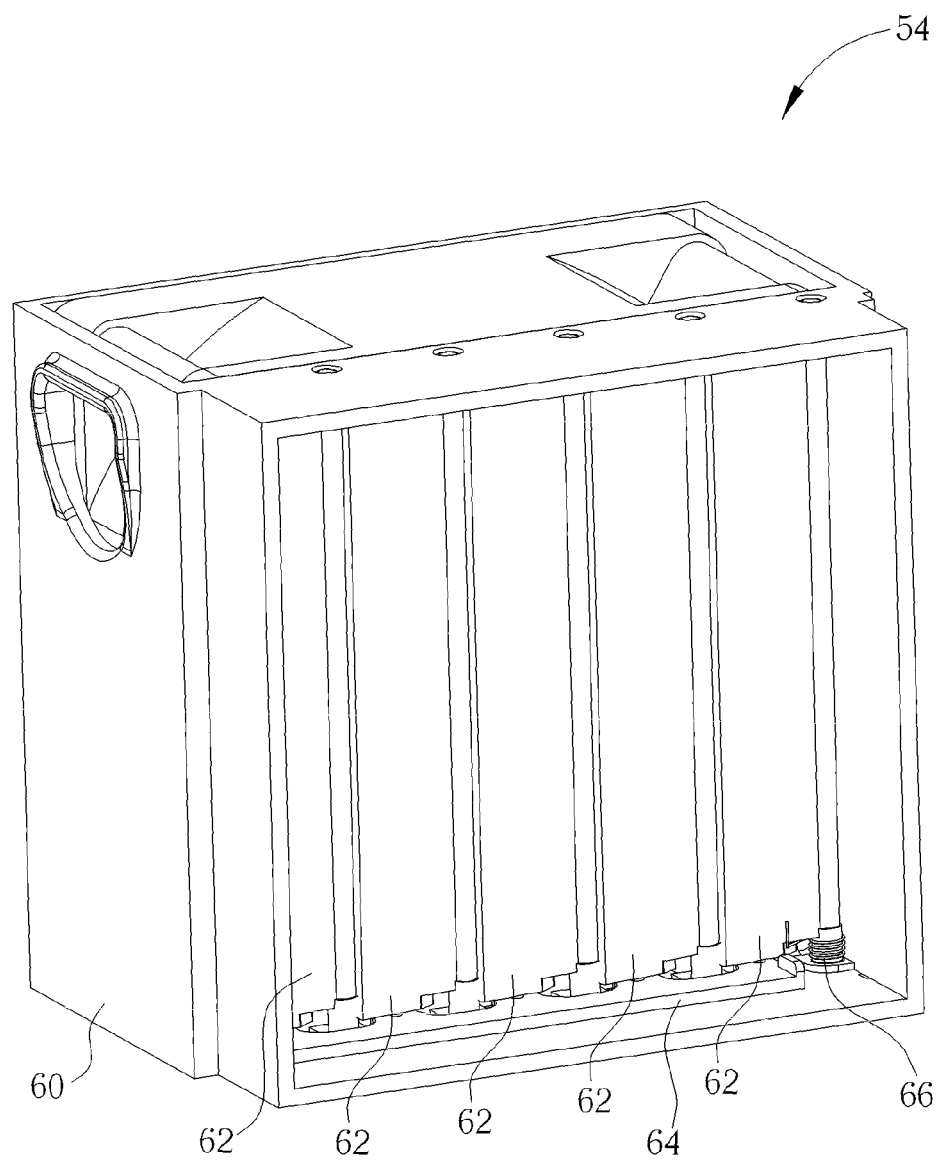
FIG. 3 and FIG. 4 are diagrams of a plurality of shutters 62 of the heat dissipating module positioning on a close position in different views according to the preferred embodiment of the present invention.
Figure 4:
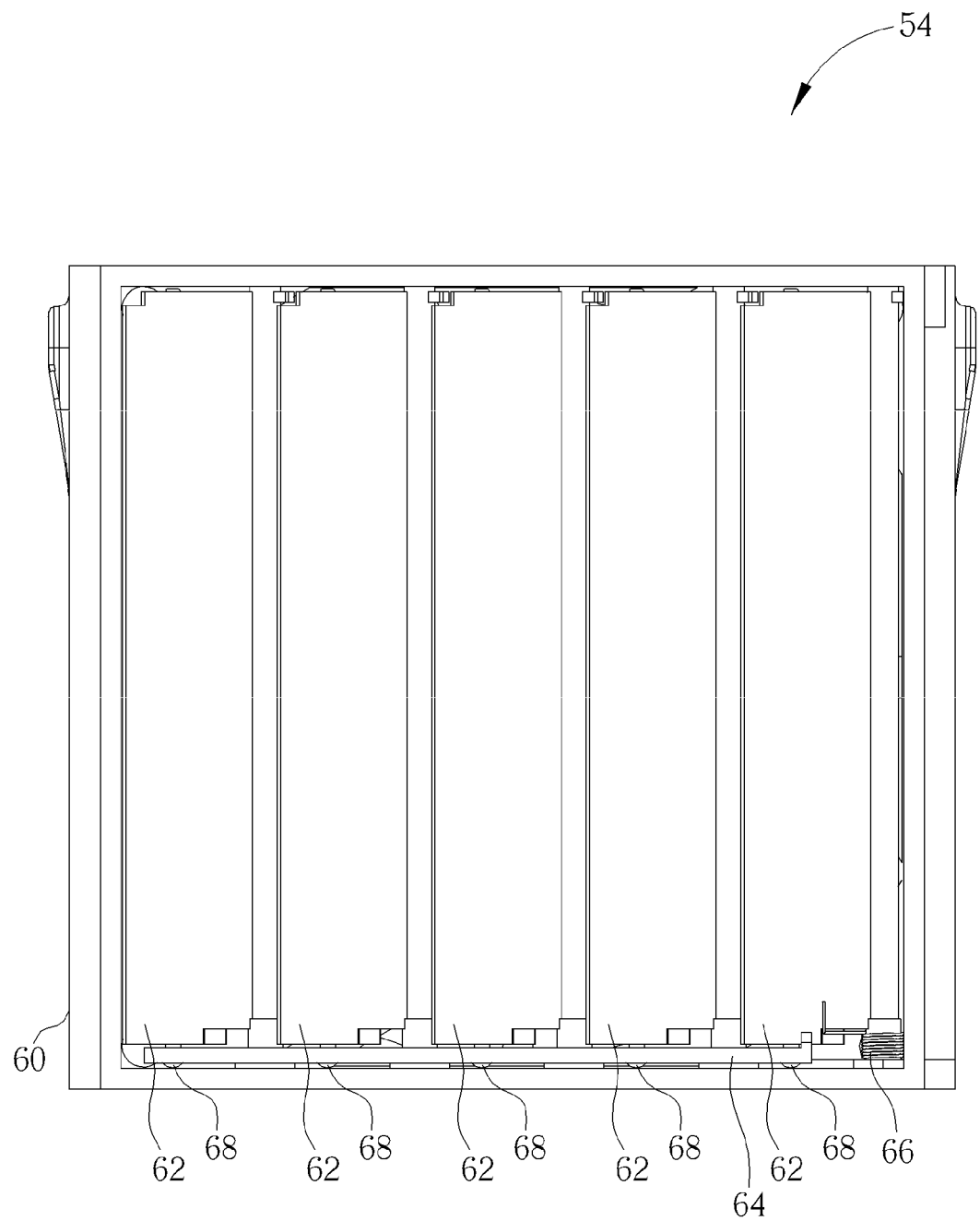

Please refer to FIG. 1 to FIG. 4. FIG. 3 and FIG. 4 are diagrams of the plurality of shutters 62 of the heat dissipating module 54 positioning on a close position in different views according to the preferred embodiment of the present invention. The heat dissipating structure 58 further includes a resilient component 66 for providing a resilient force to the shutter 62, so as to rotate the shutter 62 from an open position as shown in FIG. 1 to the close position as shown in FIG. 3 and FIG. 4. The resilient component 66 can be a twist spring. In this embodiment, the resilient component 66 can be connected to a shutter of the plurality of shutters 62, so that the linkage 64 connected to the shutter can drive the other shutters to rotate in a direction whereto the resilient component 66 drives the shutter 62, so as to drive the plurality of shutters 62 simultaneously. In addition, the resilient component 66 can be connected to the linkage 64. When the resilient 66 drives the linkage 64, the linkage 64 can rotate the plurality of shutters 62 simultaneously. Besides, at least one protruding part 68 can be disposed on a side of linkage 64 facing to a bottom of the frame 60 for contacting the frame 60. The protruding part 68 can be a spherical protrusion. Therefore, when the linkage 64 moves relative to the frame 60, friction between the frame 60 and the linkage 64 is decreased due to small contact between the protruding part 68 and the frame 60.

Detailed description of the heat dissipating module 54 for preventing the airflow from flowing back is introduced as follows. As shown in FIG. 1, the airflow driven by the fan 56 can push the plurality of shutters 62 when the fan 56 works. Meanwhile, the resilient component 66 connected to the shutter 62 is compressed by the shutter 62 in a forced deformation status. That is to say, the airflow driven by the fan 56 rotates the shutter 62 so as to decrease a forced area of the shutter 62 by the airflow, and the airflow forcing on the shutter 62 is decreasing accordingly. At this time, deformation of the resilient component 66 compressed by the shutter 62 is increasing, so that the resilient force of the resilient component 66 pressing the shutter 62 is increasing. When the airflow force from the fan 56 forcing on the shutter 62 is not greater than the resultant of the resilient force of the resilient component 66 and the friction force between the protruding part 68 of the linkage 64 and the frame 60 as the shutter 62 is rotating, the total weight of the shutter 62 and the linkage 64, the airflow driven by the fan 56, the friction force between the protruding part 68 of the linkage 64 and the frame 60, and the resilient force of the resilient component 66 are in the forced equilibrium, so that the shutter 62 stops rotating and a balanced angle is formed between the shutter 62 and the opening 602 on the frame 60.

In conclusion, the present invention can adjust the angle between the shutter 62 and the opening 602 on the frame 60 by adjusting the resilient component 66, so as to control the amount of the airflow passing through the opening 602. On the other hand, when the fan 56 stops and the fan 56 can not drive the airflow, and the shutter 62 can not compress the resilient component 66 by the airflow, so that the resilient component 66 provides the resilient force to rotate the shutter 62 to the close position as shown in FIG. 3 and FIG. 4. Therefore, the shutter 62 can cover the corresponding opening 602 when the fan 56 stops, so as to prevent the airflow driven by the other fan from flowing back to the other side of the shutter 62 through the opening 602. Thus, the present invention can reserve the cooling airflow to keep the cooling efficiency of the fan 56. In addition, when the resilient component 66 provides the resilient force to the shutter 62 of the plurality of shutters 62, the linkage 64 connected to the shutter 62 can drive the other shutters 62 to rotate in the direction whereto the resilient component 66 drives the shutter 62, so as to simultaneously drive the plurality of shutters 62 to the close position as shown in FIG. 3 and FIG. 4.

Comparing to the prior art, the heat dissipating structure of the present invention utilizes the resilient force to drive the shutter to cover the opening, so as to prevent the airflow from flowing back. The heat dissipating structure of the present invention for driving the shutter to cover the opening utilizes the resilient force capable of being adjusted easily to replace the gravity of the shutter. The present invention not only has low manufacturing cost, but also can improve the conventional drawback that the angle between the shutter and the opening in the forced equilibrium is adjusted by the power of the fan and the material of the shutter. In addition, when the fan has low power, the present invention can utilize the spring having low resilient coefficient to drive the shutter for preventing the airflow from flowing back. When the fan has high power, the present invention can utilize the spring having high resilient coefficient to drive the shutter for preventing the airflow from flowing back and for preventing the shutter from moving by the leaking airflow.

Those skilled in the art will readily observe that numerous modifications and alterations of the device and method may be made while retaining the teachings of the invention.

What is claimed is:

1. A heat dissipating structure comprising:
   a frame forming an accommodating space inside and an opening being formed on a lateral side of the frame;
   a plurality of shutters, each of the plurality of shutters pivoted to the frame;
   a linkage connected to the plurality of shutters so as to drive the plurality of shutters simultaneously, the linkage having at least one protruding part disposed on a side of the linkage contacting the frame for reducing friction between the linkage and the frame; and
   a resilient component for rotating the plurality of shutters to a close position.

2. The heat dissipating structure of claim 1, wherein the resilient component is connected to one shutter of the plurality of shutters, and the linkage drives the other shutters of the plurality of shutters to rotate in a direction whereto the resilient component drives the plurality of shutters.

3. The heat dissipating structure of claim 1, wherein the resilient component is connected to the linkage.

4. An electronic device comprising:
   a heat source; and a heat dissipating module for dissipating heat generated by the heat source, comprising:
  a fan for driving airflow so as to dissipate the heat generated by the heat source; and
  a heat dissipating structure for guiding the airflow driven by the fan, the heat dissipating structure comprising:
    a frame forming an accommodating space inside for accommodating the fan and an opening being formed on a lateral side of the frame;
    a plurality of shutters, each of the plurality of shutters connected to the frame in a rotatable manner for preventing air from flowing through the opening when the plurality of shutters rotates to a close position; and
    a linkage connected to the plurality of shutters so as to drive the plurality of shutters simultaneously, the linkage having at least one protruding part disposed on a side of the linkage contacting the frame for reducing friction between the linkage and the frame;
    a resilient component for providing a resilient force to the plurality of shutters so as to drive the plurality of shutters to the close position.

5. The electronic device of claim 4, wherein the resilient component is connected to one of shutter of the plurality of shutters, and the linkage drives the other shutters of the plurality of shutters to rotate in a direction whereto the resilient component drives the plurality of shutters.

6. The electronic device of claim 4, wherein the resilient component is connected to the linkage.

* * * * *